United States Patent [19]
Lee et al.

[11] Patent Number: 5,774,337
[45] Date of Patent: Jun. 30, 1998

[54] APPLIANCE HAVING EMI SHIELDING

[75] Inventors: Wayman Lee, Santa Clara, Calif.; Wayne H. Miller, West Linn; Bradley C. Helm, Tualatin, both of Oreg.

[73] Assignee: Apple Computer, Inc., Cupertino, Calif.

[21] Appl. No.: 431,421

[22] Filed: May 1, 1995

[51] Int. Cl.$^6$ .................................. G06F 1/16; H05K 7/14
[52] U.S. Cl. .......................... 361/725; 361/685; 361/683
[58] Field of Search ..................................... 361/683–686, 361/724, 725, 816, 818; 174/35 R, 35 GC; 364/708.1; G06F 1/16

[56] References Cited

U.S. PATENT DOCUMENTS

| | | |
|---|---|---|
| 4,479,198 | 10/1984 | Romano et al. ..................... 364/708.1 |
| 4,728,160 | 3/1988 | Mondor et al. ......................... 312/236 |
| 5,136,468 | 8/1992 | Wong et al. ............................ 361/725 |
| 5,172,305 | 12/1992 | DeWilde ................................. 361/785 |
| 5,495,389 | 2/1996 | Dewitt et al. .......................... 361/683 |
| 5,587,877 | 12/1996 | Ryan et al. ............................. 361/724 |
| 5,600,538 | 2/1997 | Xanthopoulos ......................... 361/685 |

*Primary Examiner*—Lynn D. Feild
*Attorney, Agent, or Firm*—Burns, Doane, Swecker & Mathis, L.L.P.

[57] ABSTRACT

An appliance such as a personal computer includes a metal chassis which has a first section, and a second section mounted on the first section. The first chassis section forms a first space in which a motherboard is mounted. The second chassis section forms a second space in which a disk drive is mounted. The second chassis section defines a shield resisting the passage of electromagnetic waves between the first and second spaces to isolate the motherboard from a disk opening for the disk drive thereof.

18 Claims, 6 Drawing Sheets

APPLIANCE HAVING EMI SHIELDING

BACKGROUND OF THE INVENTION

The invention relates to appliances, such as personal computers having a chassis or enclosure which houses the electrical components and creates EMI shielding there for.

A personal computer typically comprises a metallic chassis which houses, and provides electromagnetic interference (EMI) shielding for, certain electrical operational components of a computer, such as a motherboard, power supply, disk drive, electric cables, plug-in connectors, cooling fan, etc. An outer housing can also be provided for enclosing the chassis.

The computer is assembled by installing the operational components within the chassis. The components can be fastened to an outer chassis part and/or to subchassis parts which are, in turn, secured within the main part by a suitable fastening structure, such as screws, clamps, snap-in, etc.

The operational components of the computer, especially the motherboard, tend to produce electromagnetic waves which, if they escape the confines of the computer, could possibly interfere with nearby electrical equipment, especially communications equipment. Therefore, it is necessary to restrict the escape of the waves in order to keep the emitted decibel level below legally prescribed limits.

In order to resist the escape of electromagnetic waves, an EMI shielding is provided which encloses the operational components. The shielding includes a metal chassis formed of steel for example, in which the components are encased. Openings formed in the chassis, e.g., required openings for conducting cooling air, are made smaller in size than the wavelength of the electromagnetic waves that are to be confined within the chassis, e.g. smaller than about ¼ inch.

Some openings, however, such as drive openings at the front of the computer for admitting floppy disks and compact disks cannot be made that small. Thus, the drive openings are formed by special metal shield plates which are designed to resist the escape of electromagnetic waves. Such shield plates are of relatively complex configuration (and thus expensive) in order to achieve proper electrical connection with the metal chassis for achieving the required (EMI) shielding.

Therefore, it would be desirable to isolate an appreciable portion of the electromagnetic waves from the larger escape openings, especially the drive openings. It would also be desirable to provide such isolation so that the front shield plates for the drive openings can be of less complex configuration.

SUMMARY OF THE INVENTION

The present invention relates to an appliance, such as a personal computer, comprising a metallic chassis including a first chassis section forming a first space, and a second chassis section mounted to the first chassis section and forming a second space. A first electromagnetic wave-generating component, such as a motherboard, is disposed in the first space. An opening is formed in the second chassis section communicating the second space with the extension. The first and second chassis sections define electromagnetic shielding for resisting the passage of electromagnetic waves from the first and second spaces to the exterior, and for resisting the passage of electromagnetic waves between the first and second spaces.

A second wave-generating component is mounted in the second space. The first component preferably comprises a motherboard, and the second component preferably comprises a disk drive aligned with the opening in the second chassis section.

The second chassis section preferably includes a hole extending between the first and second spaces. A power supply is mounted in the second space and is arranged to at least partially shield the hole while permitting an electric cable to pass through the hole.

The power supply is disposed immediately adjacent an upright wall of the second chassis section. The cable is sandwiched between the power supply and the upright wall to attenuate electromagnetic waves travelling along the other cable.

Preferably, the holes formed in the second chassis section are formed in a floor of the second chassis section, the floor overlying the first component disposed within the first space.

The first chassis section preferably includes at least one horizontal surface upon which the second chassis section rests.

BRIEF DESCRIPTION OF THE DRAWINGS

The objects and advantages of the invention will become apparent from the following detailed description of a preferred embodiment thereof in connection with the accompanying drawings in which like numerals designate like elements and in which.

DETAILED DESCRIPTION OF A PREFERRED EMBODIMENT OF THE INVENTION

Figure 1:
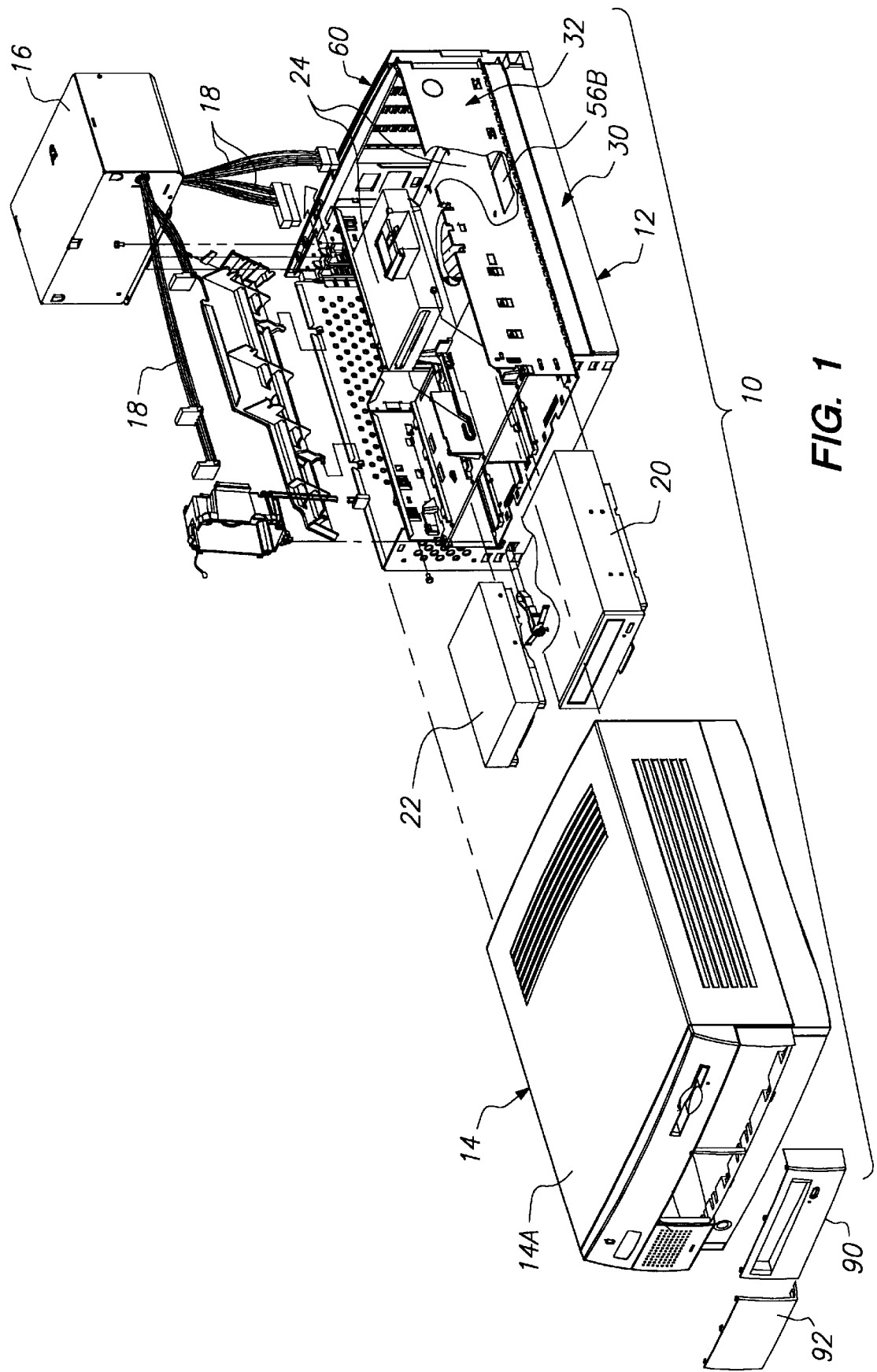
FIG. 1 is an exploded top perspective view of a personal computer according to the present invention.
Figure 2:
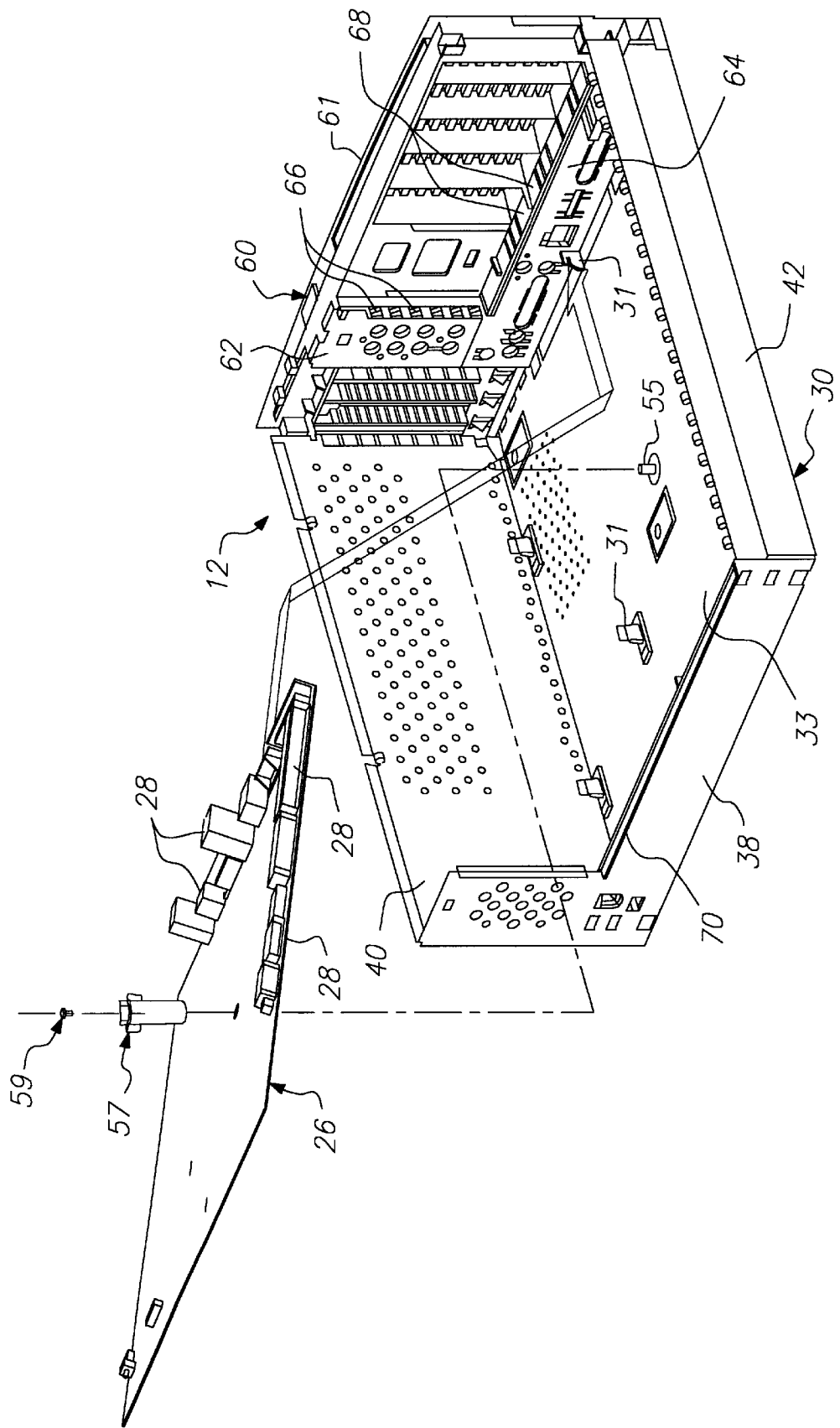
FIG. 2 is a top plan view of a main chassis section of the computer as a motherboard is being inserted therein.
Figure 3:
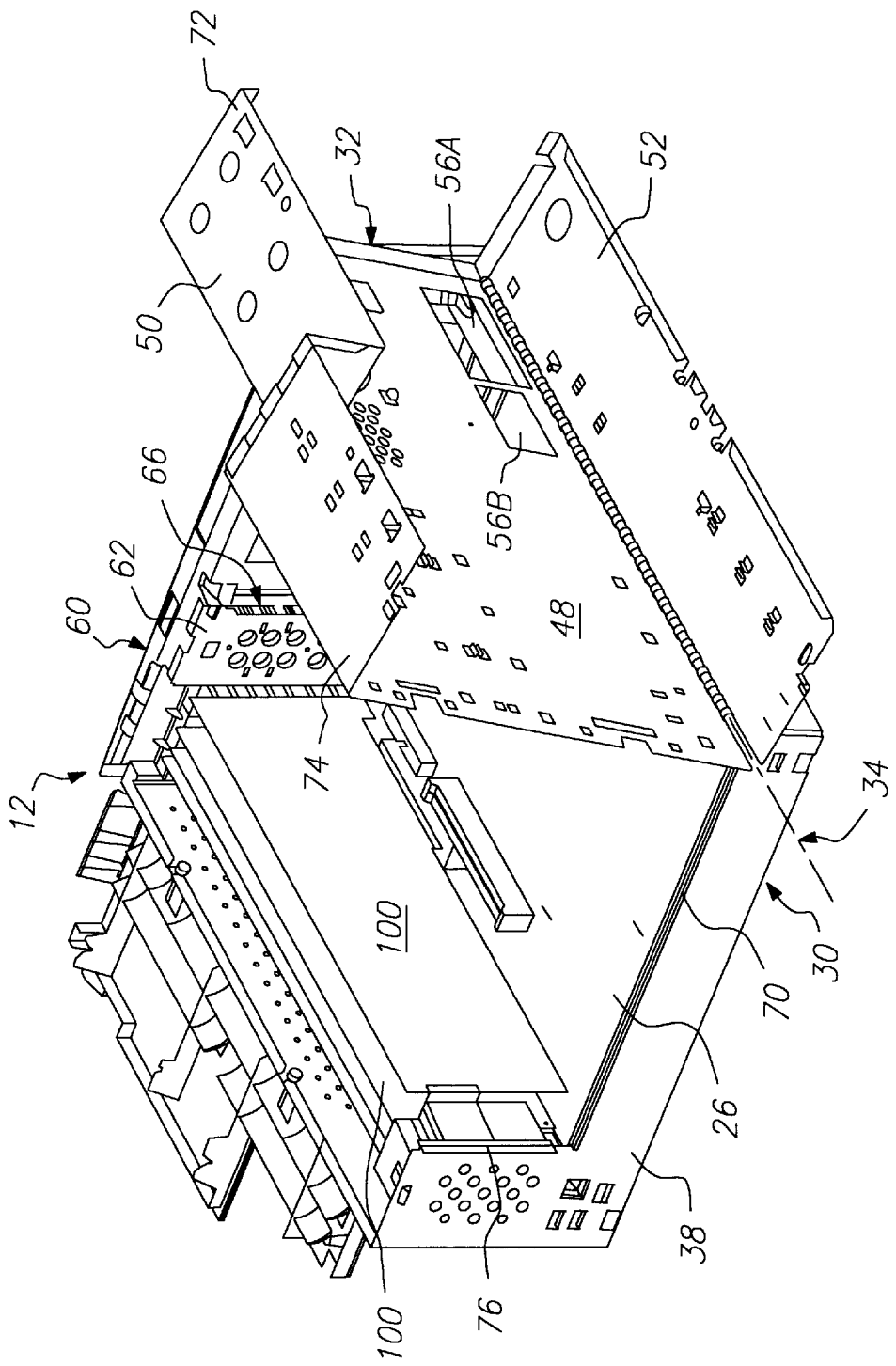
FIG. 3 is a front top perspective view of the computer chassis, with a subchassis section thereof having been swung to a folded out position.
Figure 5:
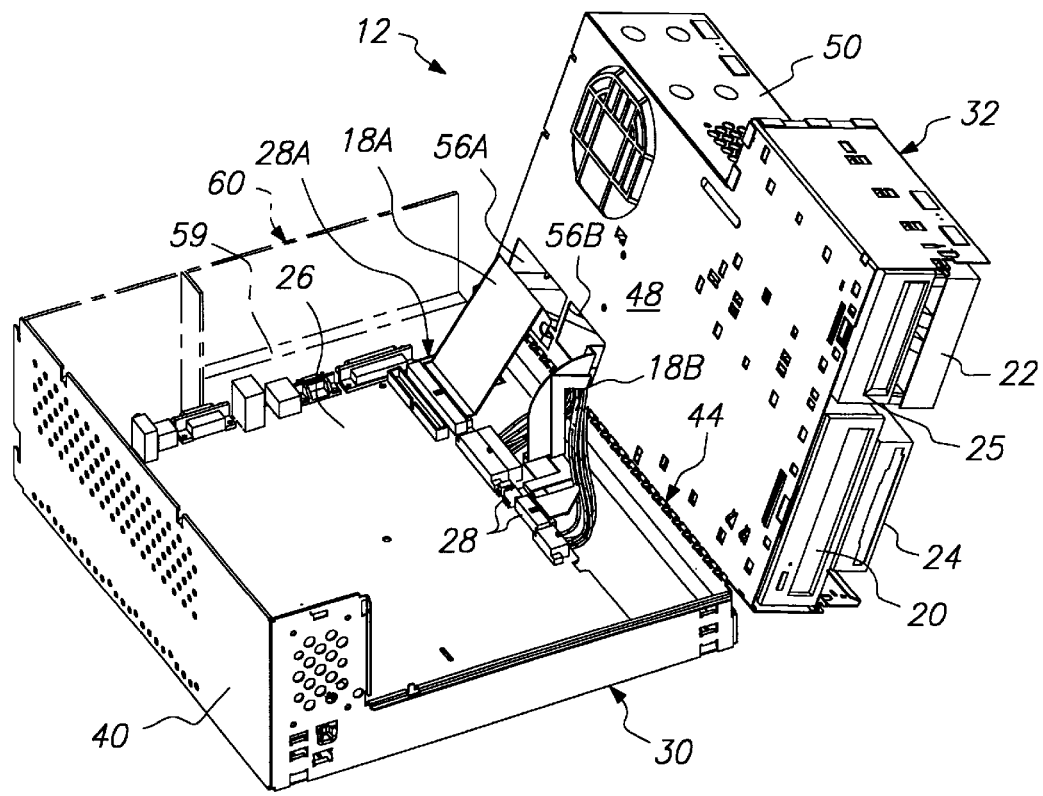
FIG. 5 is a front top perspective view of an assembled chassis, depicting cables passing through a floor of the subchassis.
Figure 6:
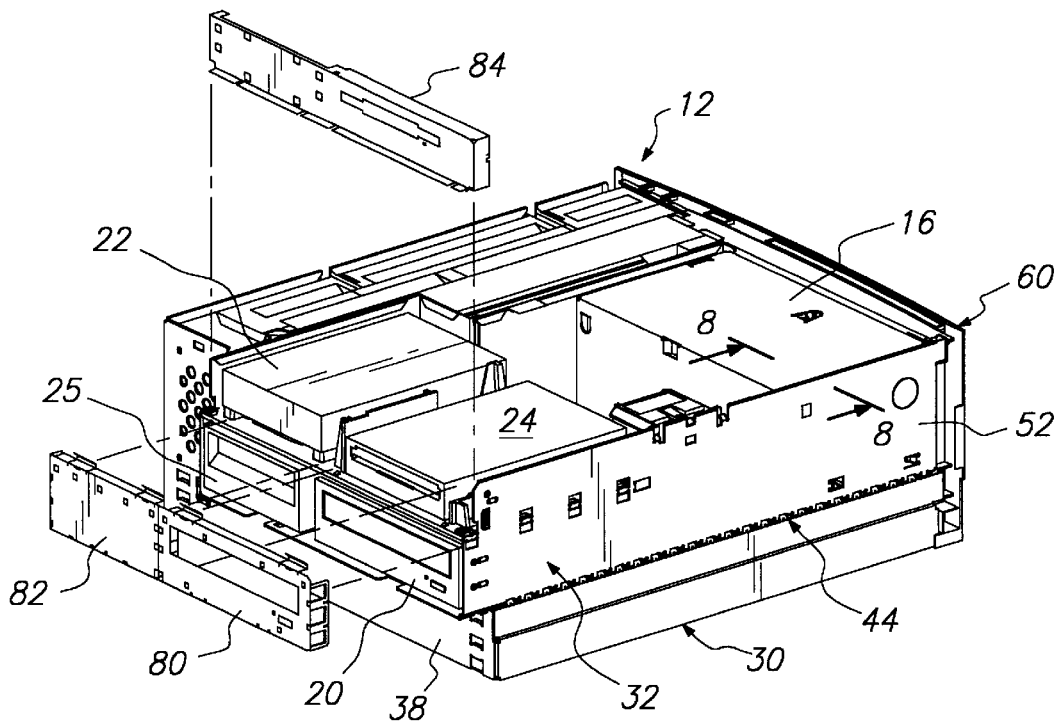
FIG. 6 is a front top perspective view of the chassis after the operational components thereof have been installed, and front shielding plates are being installed.
Figure 7:
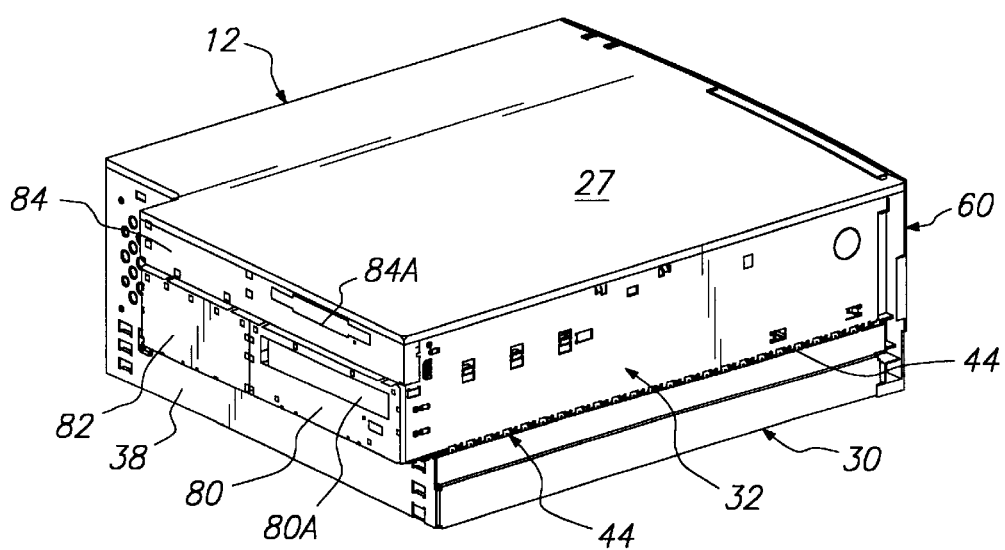
FIG. 7 is a top front perspective view of an assembled chassis.

Depicted in FIG. 1 is a personal computer 10 comprised of a metal chassis 12 (e.g., steel), an outer housing 14, and electrical operational components including a power supply 16 having electric cables 18, a CD ROM 20, a hard drive 22, and a floppy drive 24 for example. Shown in FIG. 6 is another hard drive 25. Depicted in FIGS. 2, 3 and 5 is a motherboard 26 carrying connectors 28 to which some of the cables 18 are connected. Others of the cables 18 are connected to remaining ones of the operational components 22, 25, and 20. A top portion 14A of the housing 14 carries, on its underside, a metallic shield plate 27 (shown in FIG. 7 without the housing 14) to provide EMI shielding across the top of the chassis.

The chassis 12 comprises a main or outer section 30, and a subchassis 32 hingedly connected to the main section 30 about a horizontal axis of rotation 34 (see FIG. 3). The subchassis 32 carries bays for mounting the hard and floppy disk drives 22, 24, 25, and the CD ROM 20. Also, the power supply 16 is mounted to the subchassis 32. The motherboard 26 is disposed within a space formed by the main chassis section 30 and is mounted therein in a conventional manner, e.g., by being inserted into hooks 31 secured to a bottom wall 33 of the main chassis section 30.

The main chassis section 30 includes a front wall 38 projecting upwardly from the bottom wall 33, and two side walls 40, 42 also projecting upwardly from the bottom wall. One of the side walls 42 is shorter than the other side wall 40, and is hinged to the subchassis 32 by a hinge 44. (For a detailed description of that hinge, see concurrently filed Ser. No. 08/431,417 entitled "Appliance Chassis Having Hingedly Mounted Section" the disclosure of which is incorporated herein by reference.)

The subchassis 32 includes a floor 48 and a pair of side walls 50, 52 projecting upwardly from the floor 48, one of the side walls 52 being hinged to the side wall 42 of the subchassis to form the axis 34. A hole 56A is formed in the floor 48 through which passes a cable 18A that electrically interconnects the motherboard 26 with the drives 22, 20 and 25. Another hole 56B is formed in the floor 48 through which passes a cable 18B to connect the power supply 16 to the motherboard. Also, a cable which connects the motherboard to the floppy drive 24 passes through the hole 56B.

The metal housing of the power supply 16 is disposed directly above the holes 56A, 56B to at least partially shield those holes against the passage of the electromagnetic waves.

The subchassis 32 is swingable between a closed or folded-in position shown in FIG. 2, and an open or folded-out position shown in FIG. 3. A threaded insert 55 projects upwardly from the bottom wall 33, and the motherboard rests on that insert 55. A hollow post rests on the motherboard 26 and is attached to the insert 55 by means of a screw 59 located at the bottom of the post. That screw 59 extends through a hole formed in a bottom wall of the post and also through a hole formed in the motherboard and is threaded into the insert 55. When the subchassis is swung to its folded-in position, it rests upon the post 57.

Figure 9:
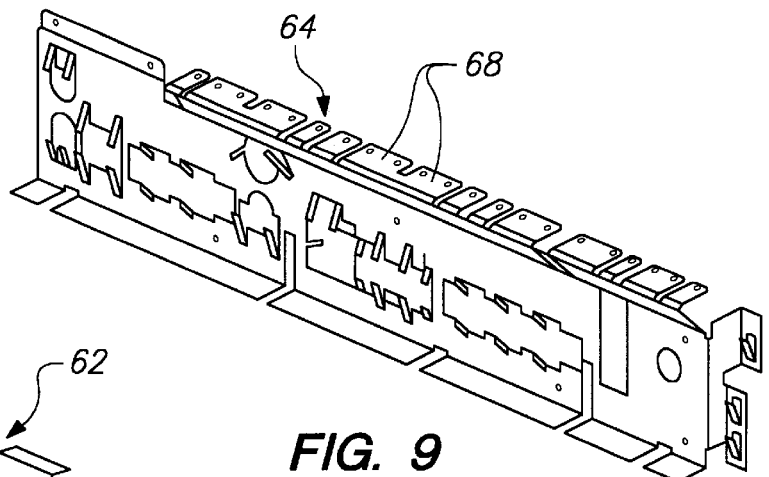
FIGS. 9 and 10 are front top perspective views of respective shield plates disposed on a rear panel.
Figure 10:
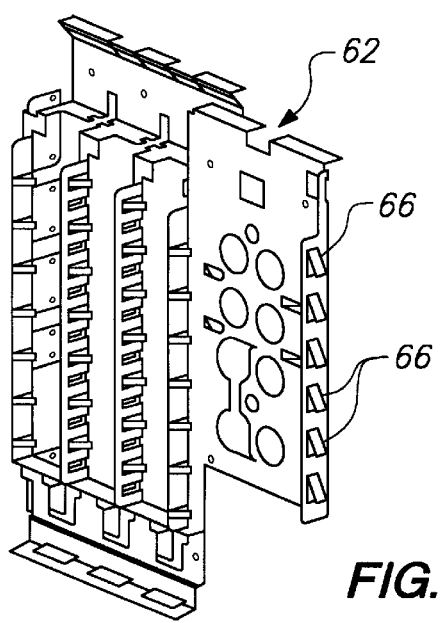

A rear portion of the main chassis section 30 is formed by a rear panel 60 which, as is conventional, includes a backing section 61 formed, for example, of plastic, and metallic shielding mounted on the inside surface of the backing section 61 (see FIG. 2). That shielding could comprise a one-piece shield or, as shown in FIGS. 9 and 10, first and second metal sheets 62, 64 formed for example of tin-plated cold rolled steel. The first sheet 62 includes a vertical, inwardly steeped shoulder comprised of a vertical row of spring fingers 66 facing toward the right in FIG. 2. The second sheet 64 includes a plurality of horizontal tabs 68 disposed upon a horizontal inwardly stepped ledge 59 of the backing section 61 (see FIG. 5).

Figure 4:
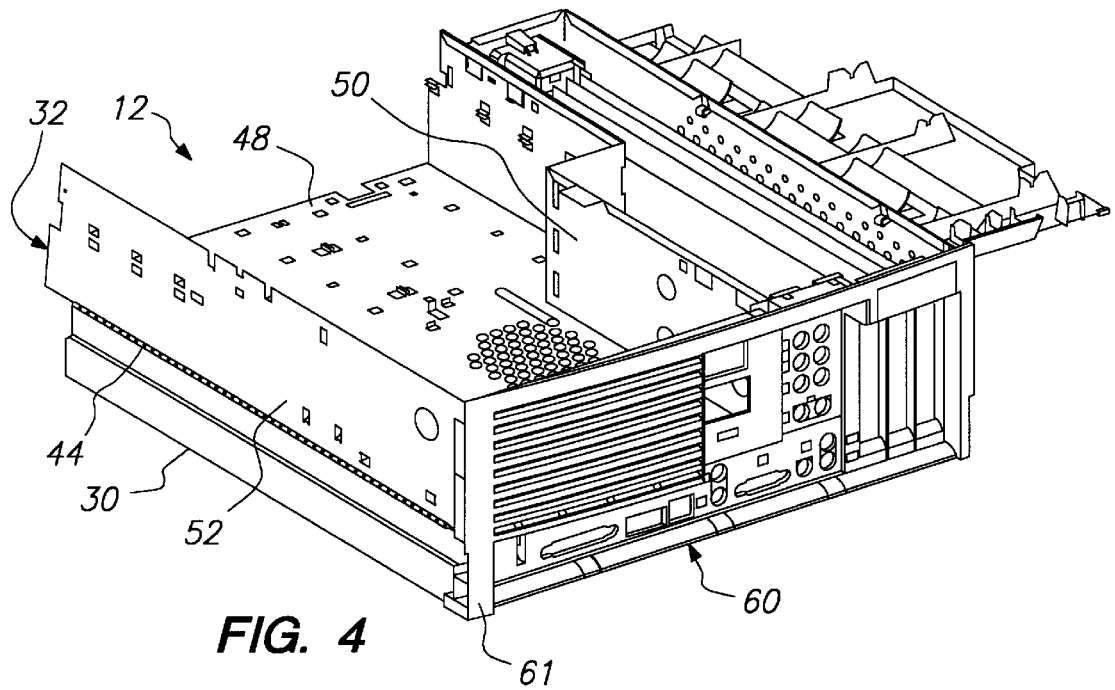
FIG. 4 is a rear top perspective view of the chassis depicted in FIG. 3, with the subchassis section having been swung to a folded in position.

The front wall 38 of the main chassis section 30 includes a horizontal edge 70 located at the same height as the tabs 68. When the subchassis 32 is in a folded-in position (FIG. 4), a front portion of the floor 48 thereof rests upon the edge 70, and a rear portion of the floor rests upon the tabs 68. Also, a vertical rear portion 72 of the side wall 50 of the subchassis 32 engages the spring fingers 66 and a vertical front portion 74 of the side wall 50 engages a vertical portion 76 of the front wall 38 of the main chassis portion. The contact of the subchassis with the tabs 68, spring fingers 66, and portions 70 and 76 creates an electrical connection therebetween to establish an EMI shield for resisting the travel of electromagnetic waves from the interior of the chassis 12 to the exterior of the computer, as well as between the main chassis portion 30 and the subchassis 32. Accordingly, the electromagnetic waves from the motherboard 26 which constitute a significant amount of the total electromagnetic wave production, are isolated from the drive openings disposed at the front of the chassis. This enables the shield plates forming the drive openings to be of less complex configuration, and thus easier and less expensive to manufacture.

It should also be understood that the hinge 44 can be constructed by a method which will resist the escape of electromagnetic waves. That method is disclosed in detail in concurrently filed application Ser. No. 08/431,419 entitled "Method of Forming a Hinge Structure" now U.S. Pat. No. 5,561,893. The disclosure of that application is incorporated by reference herein.

After the subchassis has been provided with the hard drives 22, 25, floppy drive 24, CD ROM 20 and power supply 16 (see FIG. 6), the subchassis 32 is provided with a metallic slotted CD-ROM shield plate 80, a metallic shield plate 82 (for the lower hard drive 25), and a top shield plate 84 (for the floppy drive 24 and hard drive 22. The shield plates 80, 84 form drive openings 80A, 84A, respectively, which are aligned with the drives 20 and 24.

The outer housing 14, together with its metallic cover 27, is then inserted (see FIG. 7) to complete the chassis. The outer housing 14 also includes a slotted cover 90 which overlays the CD-ROM shield 80, and a solid cover plate 92 which overlies the shield plate 82 for the hard drive 25.

Figure 8:
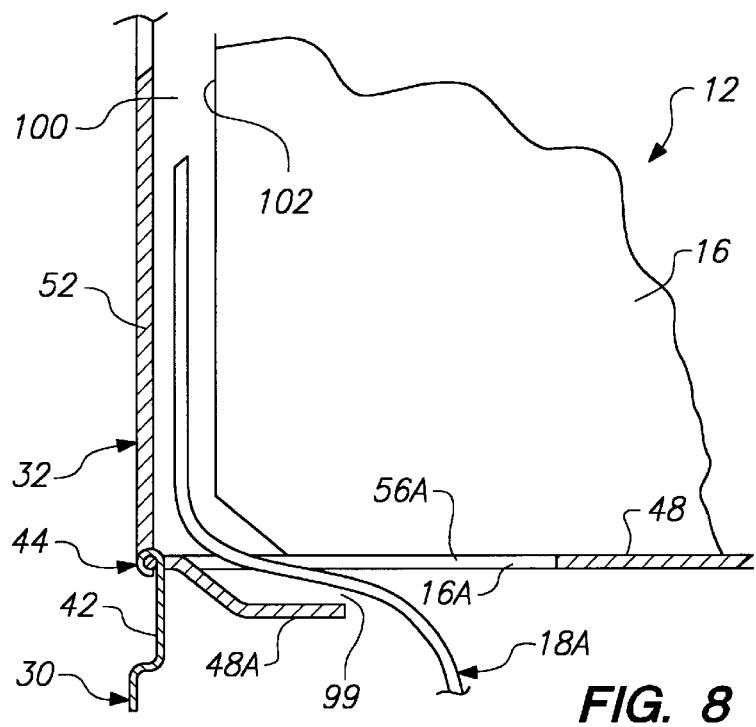
FIG. 8 is a sectional view taken along the line 8—8 in FIG. 6.

As explained earlier herein, the cable 18A extends through the hole 56A and interconnects the motherboard 26 with at least one of the drives 22, 25, or 20. A portion of the cable 18A is disposed within a channel 99 formed between a bottom 16A of the power supply 16 and a bent-down portion 48A of the floor 48 (see FIG. 8).

Another portion of the cable 18A is situated within a narrow gap 100 formed between the side wall 52 of the subchassis 32 and a side wall 102 of the power supply 16, and is thus sandwiched between those walls 52, 102 (e.g., the gap 102 can have a width of about 5 mm, as compared to a width of about 1 mm for the cable 18A). By disposing the cable 18A between those walls 16A, 48A and 52, 102, electromagnetic waves traveling along the cable 18A will be attenuated to some extent.

It will be appreciate that the present invention provides a pair of compartments that are shielded electromagnetically from one another, and from the outside. Those compartments are defined by the main chassis section 30 and the subchassis 32 which, in effect, form a faraday cage disposed within another faraday cage. In that manner, disk openings (i.e., potential sources of electromagnetic wave leakage) can be disposed in one cage, whereas the major source of electromagnetic waves, e.g., the motherboard, can be disposed in the other cage. Hence, the largest generator of such waves is isolated from the area of highest leakage risk.

Note that in the disclosed embodiment a portion of each chassis part completes the other. For example, the top plate 27 and rear panel 60 of the main chassis section completes the top and rear of the subchassis, and the side 52 and front of the subchassis completes the main chassis section. However, that need not be the case; each chassis part could be self-contained, i.e., self-completed.

In sum, with the present invention, the electromagnetic waves generated by the motherboard 26 are isolated from the largest of the potential escape openings, namely, the drive openings 80A, 84A. Thus, the risk of escape of those waves is reduced. Also, the front shield plates 80, 84 can be of less complexity and thus less expensive.

While the present invention has been disclosed in connection with a personal computer, the invention is applicable to any appliance having a chassis containing electromagnetic wave-generating components wherein it is desirable to inhibit the escape of those waves (e.g., a television).

Although the present invention has been described in connection with a preferred embodiment thereof, it will be appreciated by those skilled in the art that additions, deletions, modifications and substitutions not specifically described, may be made without departing from the spirit and scope of the invention as defined in the appended claims.

What is claimed is:

1. An appliance comprising:
   a metallic chassis including a first chassis section forming a first space, and a second chassis section mounted to said first chassis section and forming a second space;
   a metallic upright wall connected to said first chassis section;
   first and second electromagnetic wave-generating components disposed in said first space and second spaces, respectively;
   a front opening formed in said second chassis section communicating said second space with the exterior and aligned with said second electromagnetic wave-generating component; and
   a rear opening formed in said second chassis section and arranged such that said upright wall extends across and shields said rear opening;
      said second chassis section including a floor and side walls projecting upwardly therefrom, said upright wall of said first chassis section including an upwardly facing, inwardly stepped horizontally extending ledge comprising electrically conductive material on which a rear portion of said floor rests, said upright wall of said first chassis including an inwardly stepped vertical shoulder comprising electrically conductive material facing and engaging a rear end of one of said side walls of said second chassis section;
      said first and second chassis sections defining electromagnetic shielding for resisting the passage of electromagnetic waves from said first and second spaces to the exterior, and for resisting the passage of electromagnetic waves between said first and second spaces.

2. The appliance according to claim 1, wherein said upright wall comprises a rear wall of said appliance.

3. The appliance according to claim 1, wherein said first component comprises a motherboard, and said second component constitutes a disk drive aligned with said opening.

4. The appliance according to claim 1, wherein said second chassis section includes a hole extending between said first and second spaces, a power supply being mounted in said second space and arranged to at least partially overlie and shield said hole while permitting an electric cable to pass through said hole.

5. The appliance according to claim 4, wherein said power supply is disposed immediately adjacent one of said upright walls of said second chassis section, said cable being disposed between said power supply and said one upright wall of said second chassis section to attenuate electromagnetic waves traveling along said cable.

6. The appliance according to claim 4, wherein said hole is formed in said floor of said second chassis section, said floor overlying said first component.

7. The appliance according to claim 1, wherein said first chassis section includes at least one horizontal surface upon which said second chassis section rests.

8. The appliance according to claim 1 wherein the appliance is a personal computer.

9. A personal computer, comprising:
   a metallic chassis including a first chassis section defining a first space, and a second chassis section seated on said first chassis section and forming a second space, a metallic upright wall connected to said first chassis section;
   a motherboard mounted in said first space, and
   at least one disk drive mounted in said second space and forming a front drive opening for receiving a disk;
   said second chassis section including a rear opening arranged such that said upright wall extends thereacross to shield said rear opening;
   said second chassis section including a floor and side walls Projecting upwardly therefrom, said upright wall of said first chassis section including an upwardly facing, inwardly stepped horizontally extending ledge comprising electrically conductive material on which a rear portion of said floor rests, said upright wall of said first chassis including an inwardly stepped vertical shoulder comprising electrically conductive material facing and engaging a rear end of one of said side walls of said second chassis section;
   said first and second chassis sections defining electromagnetic shielding for resisting the passage of electromagnetic waves from said first and second spaces to the exterior, and for resisting the passage of electromagnetic waves between said first and second spaces.

10. The personal computer according to claim 9, wherein said second chassis section includes a hole extending between said first and second spaces, a power supply being mounted in said second space and arranged to at least partially overlie and shield said hole while permitting an electric cable to pass through said hole.

11. The personal computer according to claim 10, wherein said hole is formed in said floor of said second chassis section, said floor overlying said motherboard.

12. The personal computer according to claim 10, wherein said power supply is disposed immediately adjacent one of said upright walls of said second chassis section, said cable being disposed between said power supply and said one wall of said second chassis section to attenuate electromagnetic waves traveling along said cable.

13. The personal computer according to claim 9, further including an electromagnetic shield plate extending across said disk drive.

14. The personal computer according to claim 9, wherein said first chassis section includes at least one horizontal surface upon which said second chassis section sits.

15. The personal computer according to claim 9, wherein said upright wall comprises a rear wall of said personal computer.

16. An appliance comprising:
   a metallic chassis including a first chassis section forming a first space, and a second chassis section mounted to said first chassis section and forming a second space;

a first electromagnetic wave-generating component disposed in said first space; and an opening formed in said second chassis section communicating said second space with the exterior;

said first and second chassis sections defining electromagnetic shielding for resisting the passage of electromagnetic waves from said first and second spaces to the exterior, and for resisting the passage of electromagnetic waves between said first and second spaces, said first chassis section including a first side wall, and said second chassis section including a bottom wall and a second side wall joined together to form a corner, said corner being hinged to said first side wall, enabling said second chassis section to be swung between folded-in and folded-out positions with respect to said first chassis section, said first and second side walls being substantially coplanar when said second chassis section is in its folded-in position, whereby said first and second side walls together form a side wall of said appliance.

17. An appliance comprising:

a metallic chassis including a first chassis section forming a first space, and a second chassis section mounted to said first chassis section and forming a second space;

a first electromagnetic wave-generating component disposed in said first space;

an opening formed in said second chassis section communicating said second space with the exterior;

said first and second chassis sections defining electromagnetic shielding for resisting the passage of electromagnetic waves from said first and second spaces to the exterior, and for resisting the passage of electromagnetic waves between said first and second spaces, said second chassis section including a floor overlying said first component, a hole formed in said floor and extending between said first and second spaces; and a power supply mounted in said second space and arranged to at least partially overlie and shield said hole while permitting an electric cable to pass through said hole.

18. A personal computer, comprising:

a metallic chassis including a first chassis section defining a first space, and a second chassis section seated on said first chassis section and forming a second space;

a motherboard mounted in said first space, and at least one disk drive mounted in said second space and forming a drive opening for receiving a disk;

said first and second chassis sections defining electromagnetic shielding for resisting the passage of electromagnetic waves from said first and second spaces to the exterior, and for resisting the passage of electromagnetic waves between said first and second spaces, said second chassis section including a floor overlying said motherboard, a hole formed in said floor and extending between said first and second spaces; and a power supply mounted in said second space and arranged to at least partially overlie and shield said hole while permitting an electric cable to pass through said hole.

\* \* \* \* \*